(12) United States Patent
Elmiger et al.

(10) Patent No.: US 12,422,484 B2
(45) Date of Patent: Sep. 23, 2025

(54) DETECTING WELDED RELAY CONTACTS USING ELECTRICAL PULSE

(71) Applicant: Rockwell Automation Technologies, Inc., Mayfield Heights, OH (US)

(72) Inventors: David Elmiger, Hitzkirch (CH); Kyle B. Adkins, Oak Creek, WI (US); Andrew E. Carlson, Franklin, WI (US); David M. Messersmith, Kenosha, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 183 days.

(21) Appl. No.: 18/338,870

(22) Filed: Jun. 21, 2023

(65) Prior Publication Data

US 2024/0426912 A1 Dec. 26, 2024

(51) Int. Cl.
*G01R 31/327* (2006.01)

(52) U.S. Cl.
CPC .................. *G01R 31/3278* (2013.01)

(58) Field of Classification Search
CPC .................................................. G01R 31/3278
See application file for complete search history.

(56) References Cited

U.S. PATENT DOCUMENTS

| 4,914,315 | A | * | 4/1990 | Nickolai | ............... | H01H 47/002 |
| | | | | | | 361/170 |
| 8,901,934 | B2 | * | 12/2014 | Namou | ............... | G01R 31/3278 |
| | | | | | | 324/423 |

| 2008/0089000 | A1 | 4/2008 | Drake |
| 2015/0137819 | A1 | 5/2015 | Giordano |
| 2015/0346282 | A1 | 12/2015 | Jeon |
| 2016/0009189 | A1 | 1/2016 | Yoshizawa |
| 2017/0368951 | A1 | 12/2017 | Adlhoch |
| 2018/0158633 | A1 | 6/2018 | Brandt |
| 2018/0315565 | A1 | 11/2018 | Zhang |
| 2023/0101428 | A1 | 3/2023 | Adkins et al. |

(Continued)

FOREIGN PATENT DOCUMENTS

| CN | 112041694 A | 12/2020 |
| CN | 110140056 B | 4/2021 |

(Continued)

OTHER PUBLICATIONS

Elmiger, et al; U.S. Appl. No. 17/660,711, filed Apr. 26, 2022.

*Primary Examiner* — Walter L Lindsay, Jr.
*Assistant Examiner* — Milton Gonzalez

(57) ABSTRACT

A system includes a relay system and a controller. The relay system includes a plurality of relays. The controller is configured to transmit a close signal to a first relay of the plurality of relays, and to transmit a pulse signal to a second relay of the plurality of relays. The pulse signal is configured to have a sufficient electrical magnitude and duration to close the second relay when the second relay has an electrical weld, and to have an insufficient electrical magnitude and duration to close the first contact and the second contact of the second relay when the second relay has no electrical weld. The controller is also configured to measure a current flow through the second relay in response to the pulse signal; and based on the current flow through the second relay, determine whether the electrical weld exists in the second relay.

20 Claims, 8 Drawing Sheets

(56) References Cited

U.S. PATENT DOCUMENTS

| | | | |
|---|---|---|---|
| 2023/0131949 A1 | 4/2023 | Kataoka | |
| 2023/0213582 A1* | 7/2023 | Buescher | G08B 5/36 |
| | | | 340/644 |
| 2023/0343533 A1* | 10/2023 | Elmiger | G01R 31/3278 |

FOREIGN PATENT DOCUMENTS

| | | | |
|---|---|---|---|
| DE | 10160106 A1 | | 6/2002 |
| DE | 102006054294 B4 | | 4/2009 |
| JP | 09289792 A | * | 11/1997 |
| JP | 5370553 B1 | | 9/2013 |
| KR | 20140061637 A | | 5/2014 |

* cited by examiner

DETECTING WELDED RELAY CONTACTS USING ELECTRICAL PULSE

RELATED APPLICATIONS

This application is related to co-pending U.S. application Ser. No. 18/338,912, entitled "DETECTING WELDED RELAY CONTACTS USING MEASUREMENT AFTER CURRENT BREAK", filed Jun. 21, 2023, which is hereby incorporated by reference in its entirety for all purposes.

This application is related to co-pending U.S. application Ser. No. 18/338,940, entitled "DETECTING WELDED RELAY CONTACTS USING CONTACT CLOSE TIME MEASUREMENT", filed Jun. 21, 2023, which is hereby incorporated by reference in its entirety for all purposes.

This application is related to co-pending U.S. application Ser. No. 18/338,960 entitled "DETECTING WELDED RELAY CONTACTS USING SPANNER VOLTAGE MEASUREMENT", filed Jun. 21, 2023, which is hereby incorporated by reference in its entirety for all purposes.

TECHNICAL BACKGROUND

In modern industrial environments relay systems are commonly used to control the supply of power to industrial equipment such as motors and the like. These relay systems commonly include a plurality of individual relays. For example, a relay system to control three-phase electrical power supplied to a piece of equipment typically includes one or more relay for each phase of the electrical power.

Over repeated operation of relay systems, materials within the contacts of the individual relays may segregate, resulting in increased concentrations of particular metal elements within small regions of the contacts. Eventually this segregation may result in metal migration such that a relay contact is welded shut.

In double break contact relays, where each relay includes two contacts, it is straightforward to determine when both contacts of the relay are shorted. However, in situations where only one of the contacts within the relay is welded detection of the weld is much more difficult.

SUMMARY

In an implementation, a system includes a relay system and a controller. The relay system includes a plurality of relays each having a first contact on an input side of the respective relay, the input side coupled to a power source, and a second contact on a load side of the respective relay is coupled to a load. The load sides of each of the respective relays are coupled through their respective loads.

The controller includes one or more processors and a memory. The memory having stored thereon instructions that, upon execution by the one or more processors, cause the one or more processors to perform a weld detection check.

The weld detection check includes transmitting a close signal to a first relay of the plurality of relays, wherein the close signal is configured to close the first contact and the second contact of the first relay.

The weld detection check also includes transmitting a pulse signal to a second relay of the plurality of relays. The pulse signal is configured to have a sufficient electrical magnitude and duration to close the second relay when the second relay has an electrical weld of one of the first contact and the second contact of the second relay and the pulse signal is configured to have an insufficient electrical magnitude and duration to close the first contact and the second contact of the second relay when the second relay has no electrical weld.

The weld detection check further includes measuring a current flow through the second relay in response to the pulse signal, and based on the current flow through the second relay, determining whether the electrical weld of the one of the first contact and the second contact of the second relay exists.

In another implementation, a method for detecting a welded relay contact by performing a weld detection check, includes closing a first relay of a plurality of relays. Each relay of the plurality of relays includes a first contact on an input side of the respective relay and a second contact on a load side of the respective relay. The input side of each relay is coupled to a power source. The load side of each relay is coupled to a load, and the load sides of each of the respective relays are coupled through their respective loads.

The method also includes applying a pulse to a coil of a second relay of the plurality of relays. The pulse is configured to have a sufficient electrical magnitude and duration to close the second relay when the second relay has an electrical weld of one of the first contact and the second contact of the second relay and to have an insufficient electrical magnitude and duration to close the first contact and the second contact of the second relay when the second relay has no electrical weld.

The method further includes measuring a current flow through the second relay in response to the pulse, and based on the current flow through the second relay, determine whether the electrical weld of the one of the first contact and the second contact of the second relay exists.

In a further implementation, a system includes a relay system and a controller. The relay system includes a relay having a first contact on an input side of the relay, the input side coupled to a power source, and a second contact on a load side of the relay coupled to a load.

The controller includes one or more processors, and a memory having stored thereon instructions that, upon execution by the one or more processors, cause the one or more processors to perform a weld detection check.

The weld detection check includes transmitting a pulse signal to the relay. The pulse signal is configured to have a sufficient electrical magnitude and duration to close the relay when the relay has an electrical weld of one of the first contact and the second contact of the relay. The pulse signal is also configured to have an insufficient electrical magnitude and duration to close the first contact and the second contact of the relay when the relay has no electrical weld.

The weld detecting check also includes measuring a current flow from the power source through the relay and load in response to the pulse signal, and based on the current flow through the relay, determining whether the electrical weld of the one of the first contact and the second contact of the relay exists.

BRIEF DESCRIPTION OF THE DRAWINGS

Many aspects of the disclosure may be better understood with reference to the following drawings. While several implementations are described in connection with these drawings, the disclosure is not limited to the implementations disclosed herein. On the contrary, the intent is to cover all alternatives, modifications, and equivalents.

FIG. 3 illustrates an example relay system including a single weld.

FIG. 4 illustrates the example relay system of FIG. 3 after a first relay is closed.

FIG. 5 illustrates the example relay system of FIG. 4 as a pulse is applied to the second relay.

FIG. 6 illustrates the example relay system of FIG. 5 as current is measured flowing through the first and second relays while the pulse is applied to the coil of the second relay.

DETAILED DESCRIPTION

The following descriptions of various example embodiments and implementations of a system and method for the detection of welded relay contacts using electrical pulses. As discussed above, relay systems are commonly used in the control of industrial machines. In some example embodiments, relay systems are used within motor starter controllers. These devices are used to start industrial electrical motors powered by a multi-phase power source. Typically, these power sources have three phases of alternating current (AC) power with each phase offset from the others by 120° and require relay systems having three or more relays.

When a relay is shorted within such a controller, a reversing device will suffer a line-to-line short circuit of two phases of the power source internally if a relay on the reversing phases welds. This results in a catastrophic failure and the controller may be damaged or destroyed by the event. While this example embodiment, describes a motor starter controller, many other similar controllers and their associated industrial machines suffer similar failures if a weld is undetected and the relay shorts.

In this example embodiment, single welded double break relay contacts are detected through the use of an electrical pulse applied to the coil of a relay under test. By applying power from a power source to one or more relays within a relay system, then applying a properly configured electrical pulse to the coil of the relay under test, relays having a single weld will close while relays without welds will not close.

The electrical pulse is configured with a pulse duration and amplitude such that it is sufficient to close relays having a single weld (since the non-welded contact has a narrowed gap) while it is not sufficient to close relays without welds. In various embodiments, the duration and amplitude of the electrical pulse is determined through experimentation and simulation.

This solution for detecting single welded relays provides a technical advantage by detecting these failures before they cause short circuits within the controller. This early detection allows a user to replace the controller before a potentially destructive failure of the controller.

Figure 1:
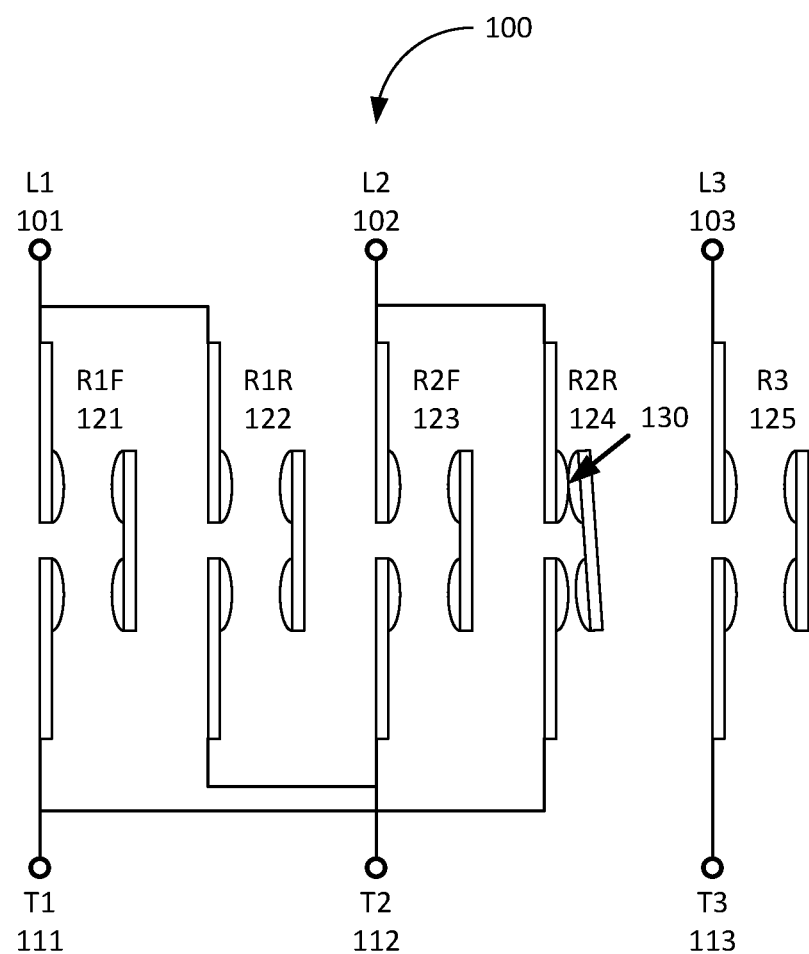
FIG. 1 illustrates an example relay system including a single weld.

FIG. 1 illustrates an example relay system 100 including a single weld 130. In this example embodiment, relay system 100 includes five relays: R1F 121, R1R 122, R2F 123, R2R 124, and R3 125. Relay system 100 includes three inputs: L1 101, L2 102, and L3 103, along with three outputs: T1 111, T2 112, and T3 113. When used in a motor starter controller, inputs L1 101, L2 102, and L3 103 are each coupled to a phase of a three-phase power source, and outputs T1 111, T2 112, and T3 113 are each coupled to a phase of an electric motor.

In this example, all of the relays: R1F 121, R1R 122, R2F 123, R2R 124, and R3 125 are off. However, relay R2R 124 has a first contact 130 which is welded shut.

Figure 2:
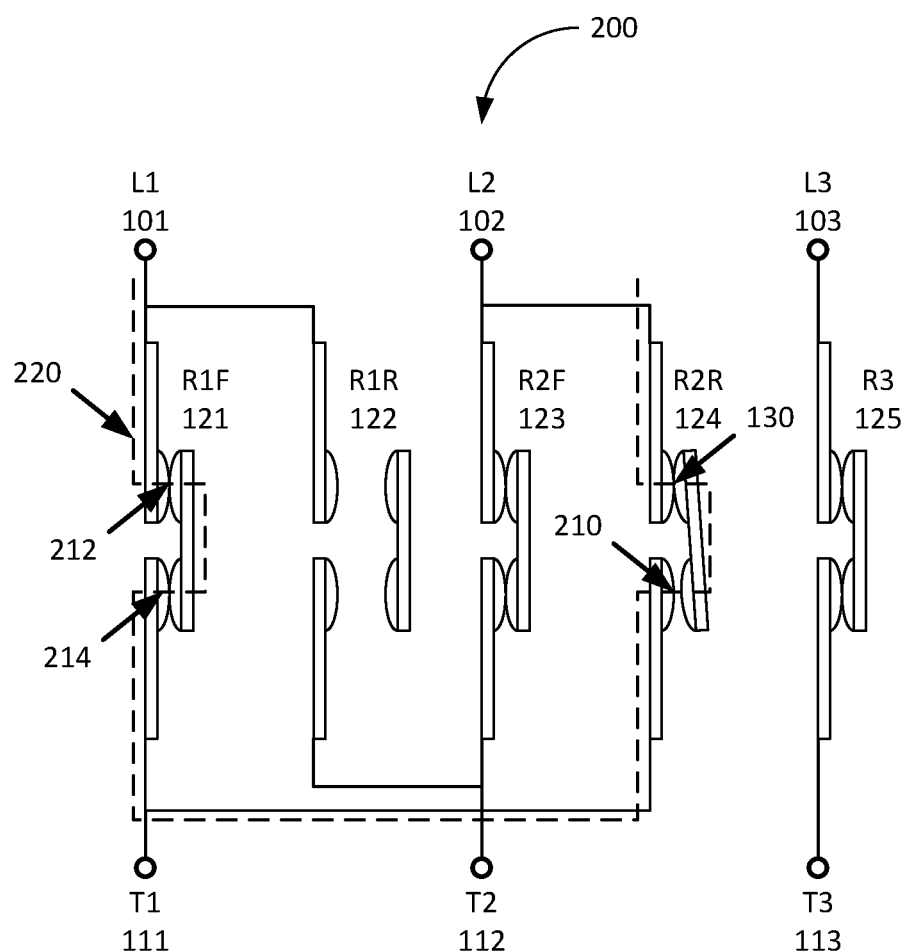
FIG. 2 illustrates the example relay system of FIG. 1 during operation where the single weld causes a short circuit.

FIG. 2 illustrates the example relay system 200 of FIG. 1 during operation where the single weld causes a short circuit. In this example embodiment, relays R1F 121, R2F 123, and R3 125 are all closed in order to drive the electric motor in a forward direction. Here, a first relay (R1F 121) is illustrated with a first contact 212 on an input side (L1 101) of the first relay, and a second contact 214 on a load side (T1 111) of the first relay.

A second relay (R2R 124) is also illustrated with a first contact 130 on an input side (L2 102) of the second relay, and a second contact 210 on a load side (T2 112) of the second relay. In this example, the first contact 130 of the second relay R2R 124 is welded.

Since the first contact 130 of the second relay R2R 124 is welded, the second contact 210 of the second relay R2R 124 has a much smaller than normal gap, and when voltage is applied, an arc may form across that gap and short the second relay R2R 124. This causes a short circuit between two phases of the input power source L1 101 and L2 102 as current flows through path 220. This short circuit may result in substantial damage to the power source and other equipment connected to relay system 200.

FIGS. 3-6 illustrate an example relay system during a series of steps performed during a method for detecting a welded relay contact by performing a weld detection check.

Figure 3:
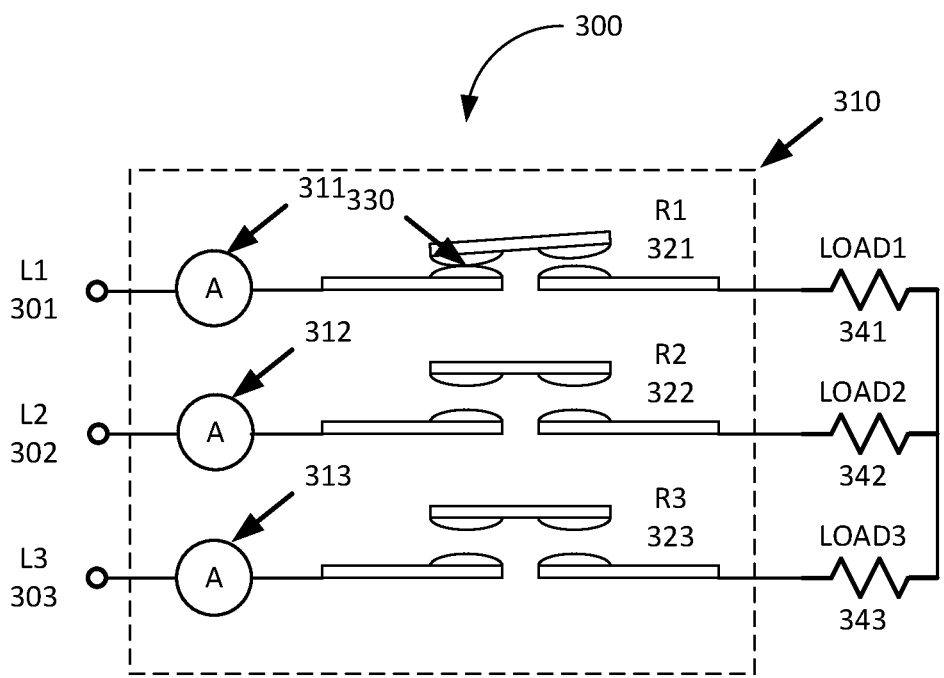
FIGS. 3-6 illustrate an example relay system during a series of steps performed during a method for detecting a welded relay contact by performing a weld detection check.

FIG. 3 illustrates an example relay system 310 including a single weld 330. In this example embodiment, a simple relay system 310 within industrial automation environment 300 is illustrated with three relays: R1 321, R2 322, and R3 323. In actual practice relay system 310 typically includes more relays, and the method illustrated in FIGS. 3-6 will be performed sequentially on some or all of the relays within relay system 310.

In this example, relay system 310 includes three current sensors 311, 312, and 313. These current sensors may utilize any of a wide variety of configurations and implementations while serving to detect welds. Here, relay system 310 includes three inputs L1 301, L2 302, and L3 303 coupled to three phases of a power source. The load sides of the relays within relay system 310 are connected to loads: LOAD1 341, LOAD2 342, and LOAD3 343 representing the loads within an industrial machine within industrial automation environment 300. The load side of each relay is coupled to a load, and the load side of each of the relays are coupled through their respective load. In this example, a first contact 330 of a second relay R1 321 is welded shut.

Figure 4:
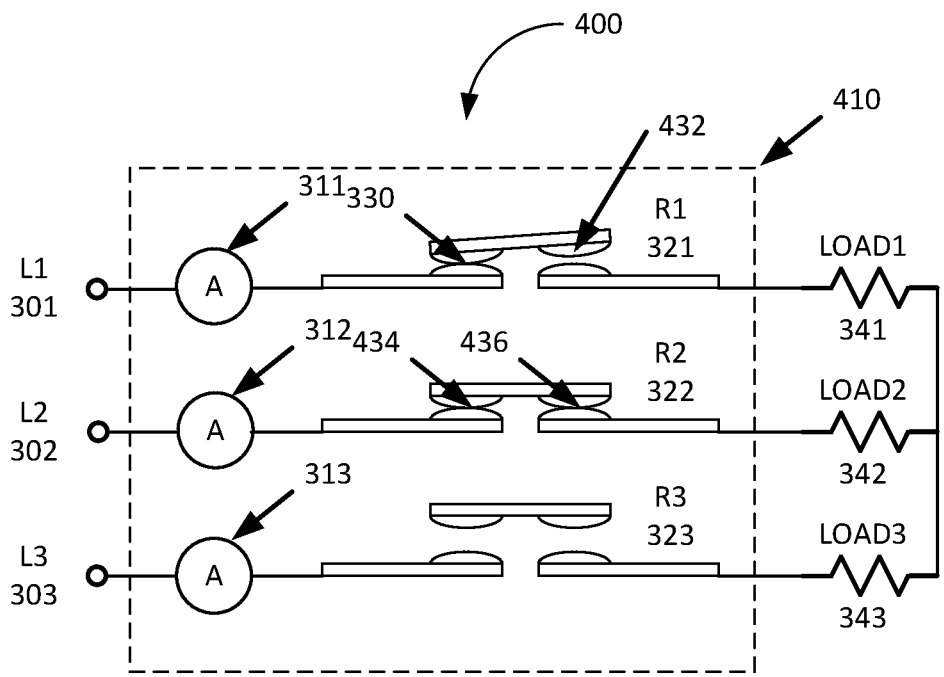

FIG. 4 illustrates the example relay system 410 of FIG. 3 within industrial automation environment 400 after a first relay R2 322 is closed. In this example, a first relay (R2 322) has a first contact 434 on an input side of the first relay R2 322 is coupled with power source L2 302 through current sensor 312 and a second contact 436 on a load side of the first relay R2 322 is coupled with LOAD2 342. A second relay R1 321 has a first contact 330 on an input side of the second relay R1 321 coupled with power source L1 301 through current sensor 311 and a second contact 432 on a load side of the second relay R1 321 coupled with LOAD1 341.

Since the first contact 330 of the second relay R1 321 is welded shut, the second contact 432 of the second relay R1 321 has a much smaller gap than a normally open contact would have. However, it still has a gap and stops current from flowing through the second relay R1 321.

Figure 5:
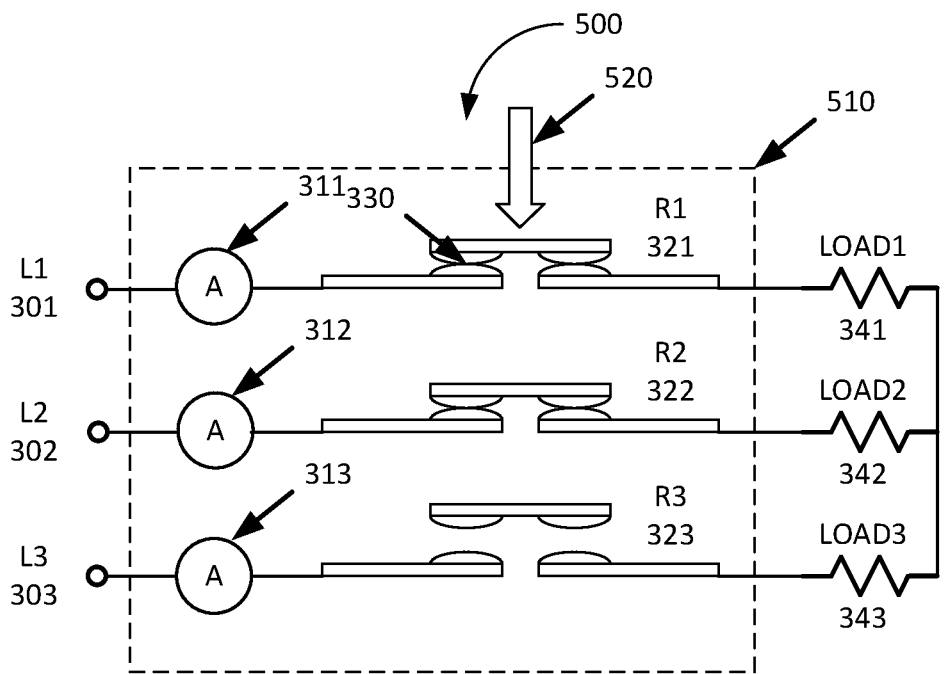

FIG. 5 illustrates the example relay system 510 of FIG. 4 within industrial automation environment 500 as a pulse 520 is applied to the second relay R1 321. In this example embodiment, a pulse signal 520 is applied to an input (typically the coil input) of the second relay R1 321 within relay system 510. In various embodiments, pulse signal 520 is either a voltage pulse or a current pulse.

The pulse signal 520 is configured to have a sufficient electrical magnitude and duration to close the second relay R1 321 when the second relay has an electrical weld of one of the first contact 330 and the second contact 432 of the second relay R1 321. (In this example the first contact 330 of the second relay R1 321 has an electrical weld.) The pulse signal 520 is also configured to have an insufficient electrical magnitude and duration to close the first contact 330 and the second contact 432 of the second relay R1 321 when the second relay R1 321 has no electrical weld.

Figure 6:
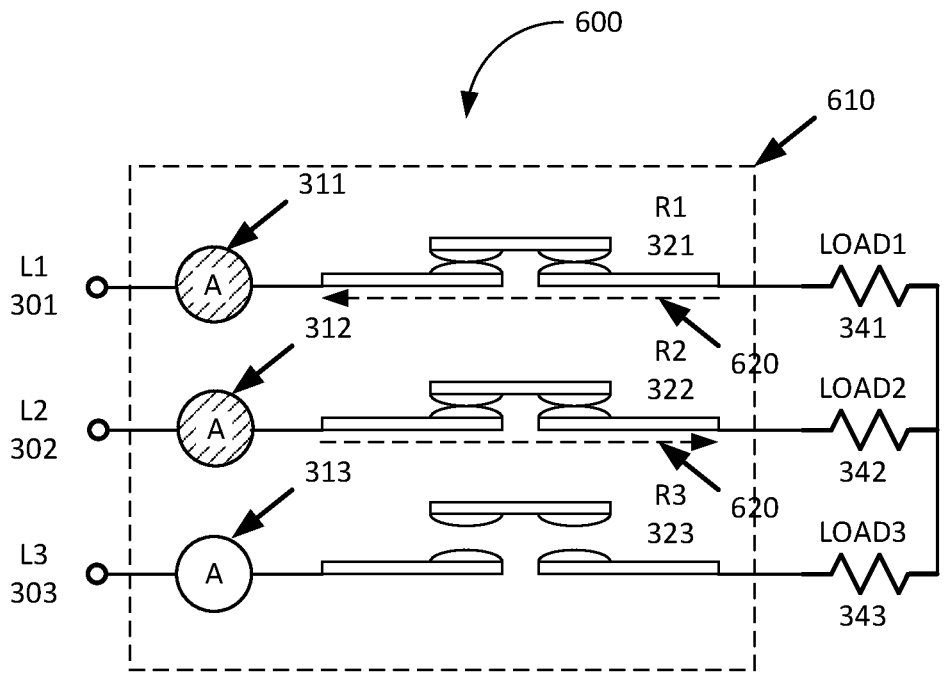

FIG. 6 illustrates the example relay system 610 of FIG. 5 within industrial automation environment 600 as current 620 is measured flowing through the first R2 322 and second R1 321 relays while the pulse 520 is applied to the second relay R1 321. When a voltage is applied between inputs L1 301 and L2 302 while pulse 520 is applied, current 620 flows between inputs L1 301 and L2 302 and in measured by current sensors 311 and 312.

In some example embodiments, the steps illustrated in FIGS. 3-6 are performed during system startup, and in some examples, these steps are performed a plurality of times to increase the probability of detecting any welds.

In response to detecting a weld, some example embodiments perform a system shutdown or disconnect the power source to prevent damage to the system and broadcast an alert message notifying users of the weld and the shutdown.

In other example embodiments, a single relay may be tested to determine if it has a welded contact. By applying a power source to the input side of the relay and a load on the load side of the relay then applying a pulse signal (as described above) to the coil input of the relay, current from the power supply may be monitored to detect whether or not the relay closes due to the pulse, indicating a single weld.

Figure 7A:
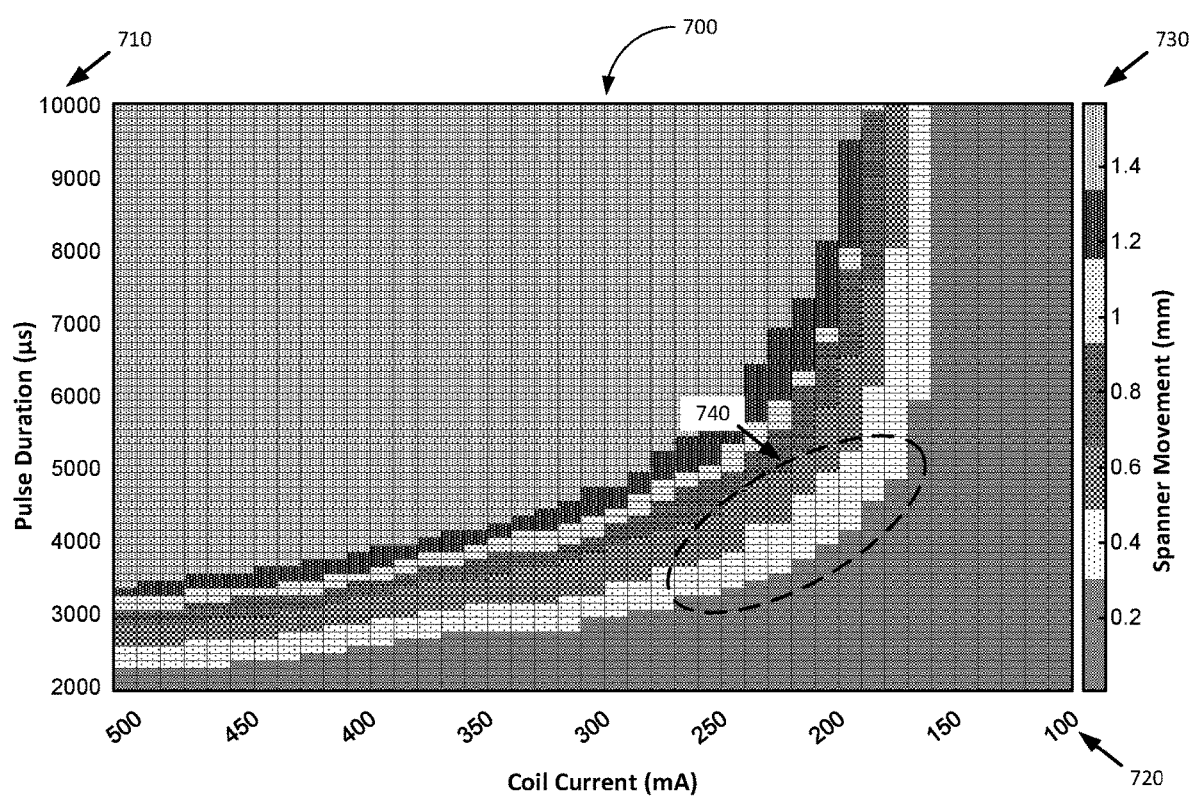
FIG. 7A illustrates a matrix of electrical parameters of the pulse applied to the coil of the second relay and the resulting spanner movement within the second relay.

FIG. 7A illustrates a matrix 700 of electrical parameters of the pulse 520 applied to the coil of the second relay R1 321 and the resulting spanner movement within the second relay R1 321. In this illustration, a range of pulse durations 710 (measured in microseconds) along the vertical axis are illustrated with a range of pulse currents 720 (measured in milliamps) along the horizontal axis. Spanner movement 730 within the second relay R1 321 is illustrated for each combination of pulse duration 710 (measured in microseconds) and pulse current 720 (measured in milliamps).

As described above, the pulse signal 520 is configured to have a sufficient electrical magnitude 720 and duration 710 to close the second relay R1 321 when the second relay has an electrical weld 330 of one its contacts, and the pulse signal 520 is configured to have an insufficient electrical magnitude 720 and duration 710 to close the first contact and the second contact of the second relay R1 321 when the second relay R1 321 has no electrical weld.

In this example embodiment, a wide range of combinations of electrical magnitude 720 and duration 710 meet these requirements. One such region 740 within matrix 700 is illustrated here, while numerous other combinations of electrical magnitude 720 and duration 710 also meet these requirements.

In some example experiments pulses of 70% nominal current for 3.4 milliseconds, 70% nominal current for 4.2 milliseconds, 45% nominal current for 10 milliseconds, and 100% nominal current for 60 milliseconds were all found to meet these requirements.

Figure 7B:
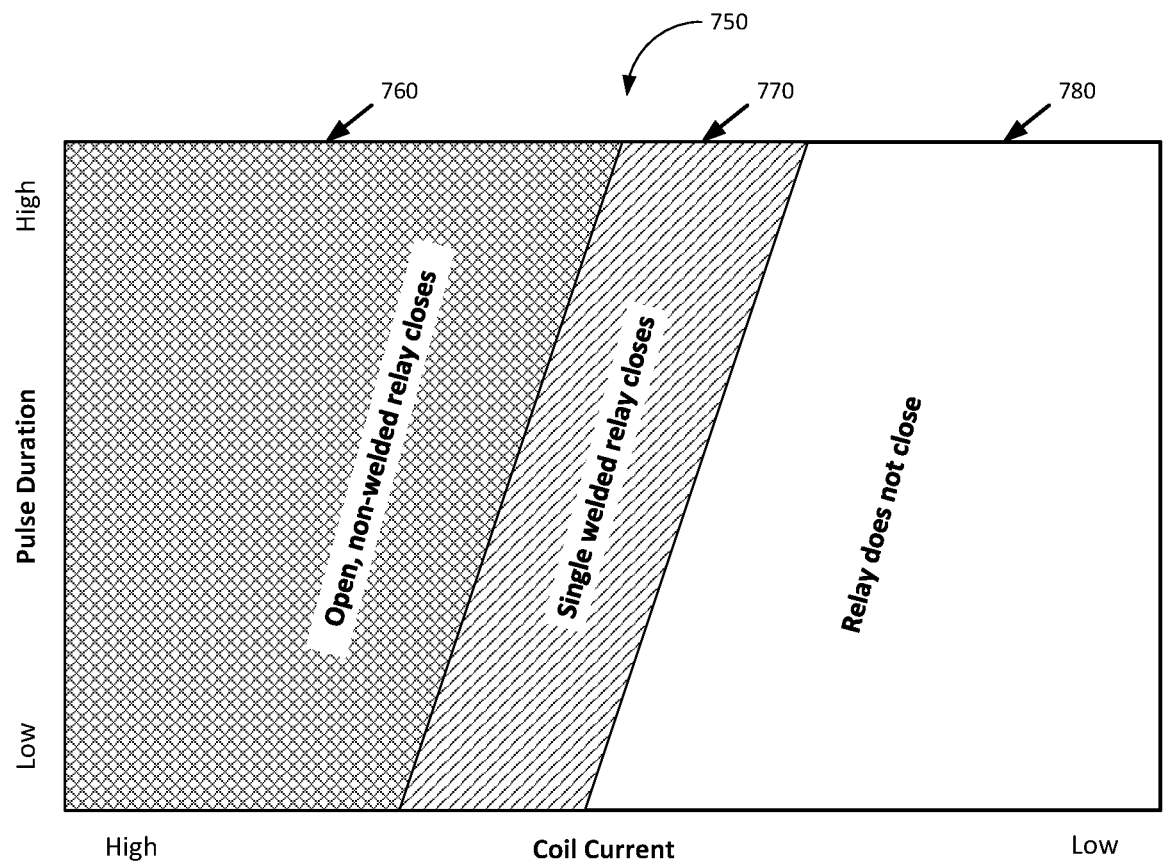
FIG. 7B illustrates a portion of the matrix illustrated in FIG. 7A.

FIG. 7B illustrates a portion 750 of the matrix 700 illustrated in FIG. 7A. In this example, a portion 750 of the matrix 700 from FIG. 7A near region 740 is enlarged and simplified for clarity. Here, the horizontal axis represents coil current with increasing coil current from right to left, and the vertical axis represents pulse duration with increasing pulse duration from bottom to top.

Three regions of results are illustrated in this figure. In region 760 the coil current and pulse duration are sufficiently large that even non-welded relays close. In region 780 the coil current and pulse duration are so low that no relays close. In region 770 the coil current and pulse duration are such that only relays having a single weld will close.

Figure 8:
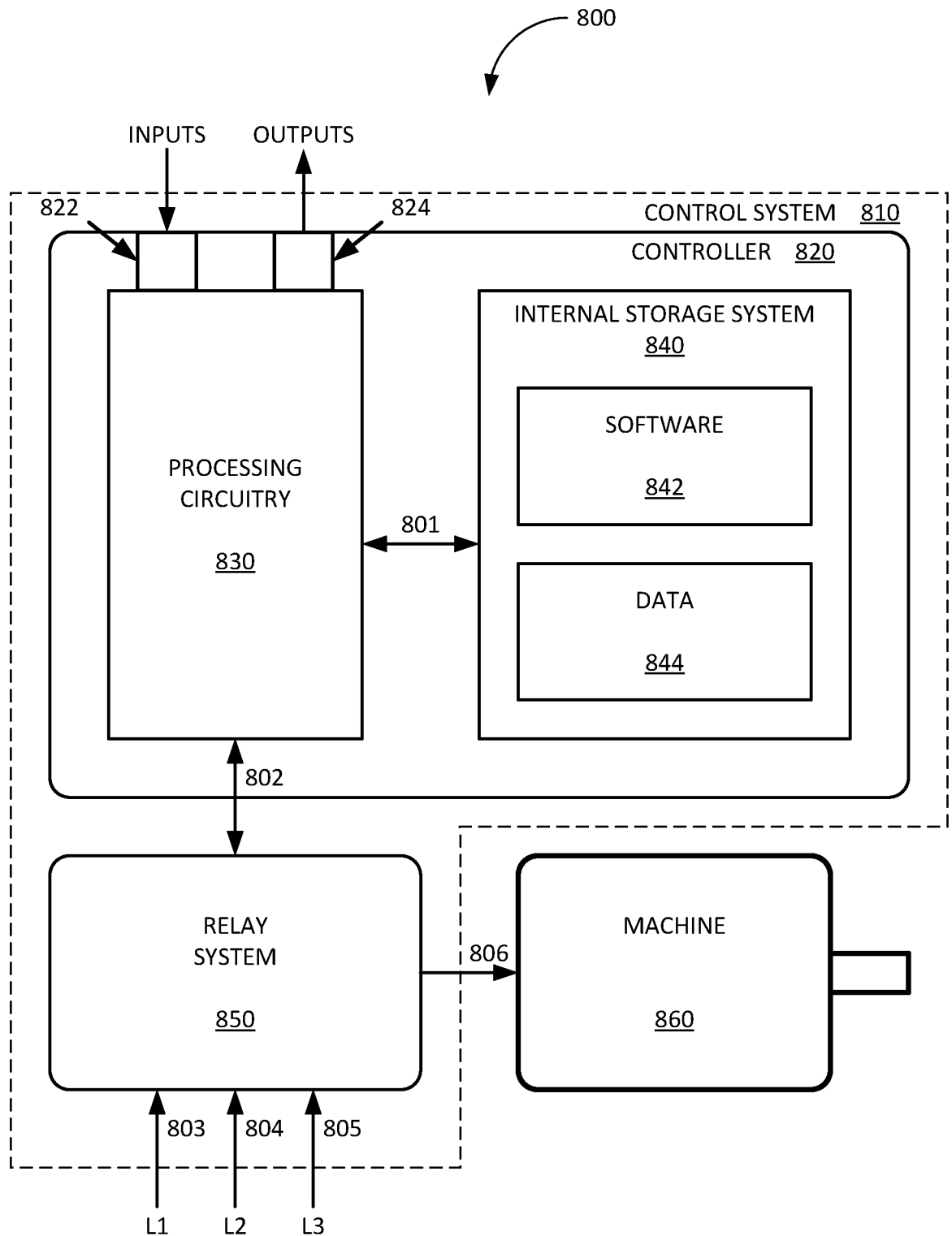
FIG. 8 illustrates an example block diagram of an industrial automation environment including a control system, configured to detect a welded relay contact, and an industrial machine.

FIG. 8 illustrates an example block diagram of an industrial automation environment 800 including a control system 810 configured to detect a welded relay contact, and an industrial machine 860. In this example embodiment, control system 810 includes controller 820 and relay system 850. Relay system 850 is similar to those illustrated in FIGS. 1-6 and described in detail above. In this example embodiment, relay system 850 receives three phases of power from a power source (not illustrated). Here, the three phases of power include L1 803, L2 804, and L3 805. Relay system 850 supplies power to machine 860 through link 806. In this example, link 806 includes at least three electrical conductors, each supplying a phase of power to machine 860. Relay system 850 receives commands from, and provides data to, controller 820 over link 802.

In this example embodiment, controller 820 includes processing circuitry 830, internal storage system 840, input port 822, and output port 824. Processing circuitry 830 is coupled with internal storage system 840 through link 801. Processing circuitry 830 is also coupled with relay system 850 through link 802.

Input port 822 is configured to receive control signals and data from external computing devices (not illustrated). Output port 824 is configured to provide control signals and data to external computing devices (not illustrated).

Processing circuitry 830 comprises electronic circuitry configured to direct control system 810 to control machine 860, and to detect a welded relay contact within relay system 850 by performing a weld detection check as described above. Processing circuitry 830 may comprise microprocessors and other circuitry that retrieves and executes software 842. Examples of processing circuitry 830 include general purpose central processing units, application specific processors, and logic devices, as well as any other type of processing device, combinations, or variations thereof. Processing circuitry 830 may be implemented within a single processing device but may also be distributed across multiple processing devices or sub-systems that cooperate in executing program instructions.

Internal storage system 840 may comprise any non-transitory computer readable storage media capable of storing software 842 that is executable by processing circuitry 830. Internal storage system 840 may also include various data structures 844 which comprise one or more registers, databases, tables, lists, or other data structures. Storage system 840 may include volatile and nonvolatile, removable and non-removable media implemented in any method or technology for storage of information, such as computer readable instructions, data structures, program circuits, or other data.

Storage system 840 may be implemented as a single storage device but may also be implemented across multiple storage devices or sub-systems co-located or distributed relative to each other. Storage system 840 may comprise additional elements, such as a controller, capable of communicating with processing circuitry 830. Examples of storage media include random access memory, read only memory, magnetic disks, optical disks, flash memory, virtual memory and non-virtual memory, magnetic cassettes, magnetic tape, magnetic disk storage or other magnetic storage devices, or any other medium which may be used to store the desired information and that may be accessed by an instruction execution system, as well as any combination or variation thereof.

Software 842 may be implemented in program instructions and among other functions may, when executed by controller 820 in general, or processing circuitry 830 in particular, direct controller 820, or processing circuitry 830, to operate as described herein to control machine 860, and to detect a welded relay contact within relay system 850 by performing a weld detection check. Software 842 may include additional processes, programs, or components, such as operating system software, database software, or application software. Software 842 may also comprise firmware or some other form of machine-readable processing instructions executable by elements of processing circuitry 830.

In general, software 842 may, when loaded into processing circuitry 830 and executed, transform processing circuitry 840 overall from a general-purpose computing system into a special-purpose computing system customized to operate as described herein for a controller 820 configured to control machine 860, and to detect a welded relay contact within relay system 850 by performing a weld detection check, among other operations. Encoding software 842 on internal storage system 840 may transform the physical structure of internal storage system 840. The specific transformation of the physical structure may depend on various factors in different implementations of this description. Examples of such factors may include, but are not limited to the technology used to implement the storage media of internal storage system 840 and whether the computer-storage media are characterized as primary or secondary storage.

For example, if the computer-storage media are implemented as semiconductor-based memory, software 842 may transform the physical state of the semiconductor memory when the program is encoded therein. For example, software 842 may transform the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate this discussion.

Figure 9:
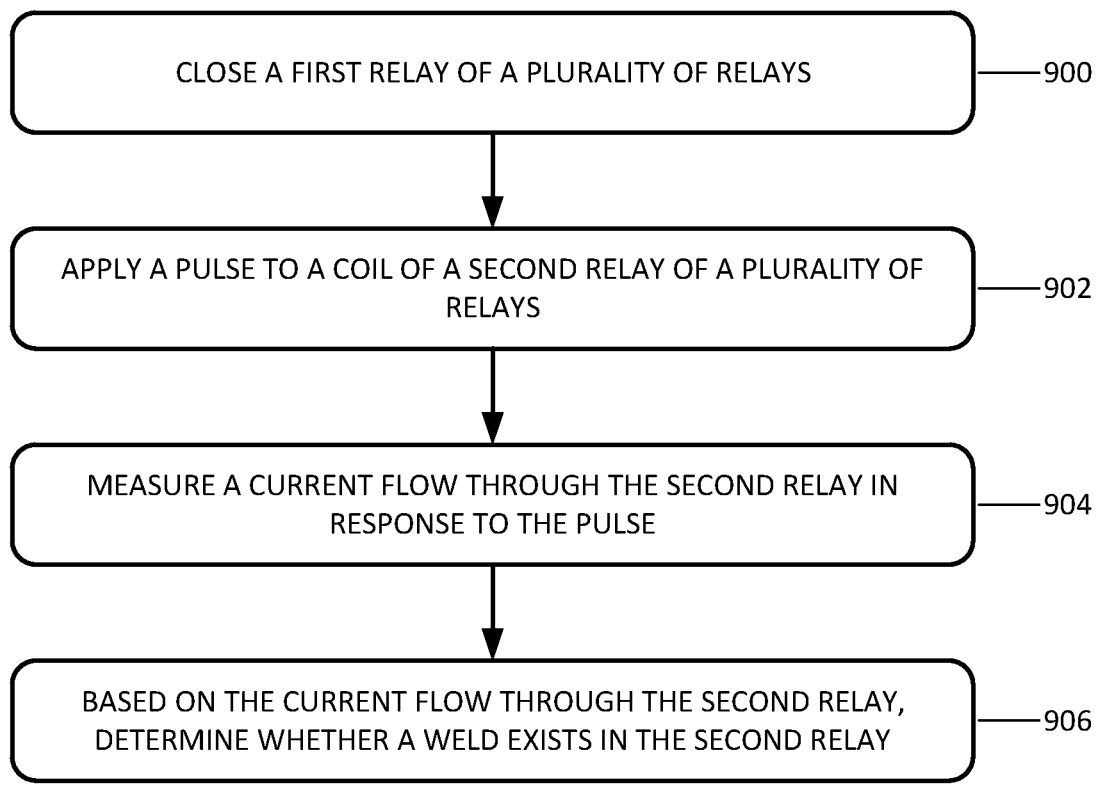
FIG. 9 illustrates a flowchart of an example method for detecting a welded relay contact by performing a weld detection check.

FIG. 9 illustrates a flowchart of an example method for detecting a welded relay contact by performing a weld detection check. In this example embodiment, controller 820 directs relay system 850 to close a first relay of a plurality of relays within relay system 850, (operation 900). Each relay of the plurality of relays includes a first contact on an input side of the respective relay and a second contact on a load side of the respective relay. The input side of each relay is coupled to a power source. The load side of each relay is coupled to a load. The load sides of each of the respective relays are coupled through their respective loads.

Controller 820 applies a pulse to a coil of a second relay of the plurality of relays within relay system 850, (operation 902). The pulse is configured to have a sufficient electrical magnitude and duration to close the second relay when the second relay has an electrical weld of one of the first contact and the second contact of the second relay. The pulse is also configured to have an insufficient electrical magnitude and duration to close the first contact and the second contact of the second relay when the second relay has no electrical weld.

Controller 820 measures a current flow through the second relay in response to the pulse, (operation 904), and based on the current flow through the second relay, determines whether the electrical weld of the one of the first contact and the second contact of the second relay exists, (operation 906).

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above may be combined in various ways to form multiple embodiments. As a result, the invention is not limited to the specific embodiments described above, but only by the claims and their equivalents.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as relays, unless otherwise stated, are generally representative of any one or more elements configured to operate as a relay or switch. Such relay components include relays, contactors, and similar components.

Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same terminals. For example, a resistor or capacitor shown and described herein as a single component may instead be multiple resistors or capacitors, respectively, coupled in series between the same two terminals as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A system, comprising:
    a relay system, comprising a plurality of relays each having a first contact on an input side of the respective relay, the input side coupled to a power source, and a second contact on a load side of the respective relay coupled to a load, wherein the load sides of each of the respective relays are coupled through their respective loads; and
    a controller, comprising:
        one or more processors; and
        a memory having stored thereon instructions that, upon execution by the one or more processors, cause the one or more processors to perform a weld detection check comprising:
            transmit a close signal to a first relay of the plurality of relays, wherein the close signal is configured to close the first contact and the second contact of the first relay;
            transmit a pulse signal to a second relay of the plurality of relays, wherein the pulse signal is configured to have a sufficient electrical magnitude and duration to close the second relay when the second relay has an electrical weld of one of the first contact and the second contact of the second relay and the pulse signal is configured to have an insufficient electrical magnitude and duration to close the first contact and the second contact of the second relay when the second relay has no electrical weld;
            measure a current flow through the second relay in response to the pulse signal; and
            based on the current flow through the second relay, determine whether the electrical weld of the one of the first contact and the second contact of the second relay exists.

2. The system of claim 1, wherein the instructions comprise further instructions that, upon execution by the one or more processors, cause the one or more processors to: perform the weld detection check on each relay of the plurality of relays sequentially.

3. The system of claim 1, wherein the instructions comprise further instructions that, upon execution by the one or more processors, cause the one or more processors to:
    in response to detecting no electrical weld of the one of the first contact and the second contact of the second relay:
        transmit an open signal to the first relay, wherein the open signal is configured to open the first contact and the second contact of the first relay;
        transmit the close signal to the second relay;
        transmit the pulse signal to the first relay;
        measure a second current flow through the first relay in response to the pulse signal to the first relay; and
        based on the second current flow through the first relay, determine whether the electrical weld of the one of the first contact and the second contact of the first relay exists.

4. The system of claim 1, wherein the weld detection check is performed on startup of the system.

5. The system of claim 1, wherein the weld detection check is performed a plurality of times.

6. The system of claim 1, wherein the close signal comprises a first electrical magnitude, wherein the sufficient electrical magnitude of the pulse signal is a percentage less than the first electrical magnitude, and wherein the sufficient duration of the pulse signal is selected based on the sufficient electrical magnitude.

7. The system of claim 1, wherein the instructions comprise further instructions that, upon execution by the one or more processors, cause the one or more processors to:
    in response to detecting the electrical weld, disconnecting the power source to shut down the system.

8. The system of claim 1, wherein the instructions comprise further instructions that, upon execution by the one or more processors, cause the one or more processors to:
    based on the current flow through the second relay in response to the close signal, detect the electrical weld of both the first contact and the second contact of the second relay.

9. The system of claim 1, wherein the pulse signal is a voltage pulse.

10. The system of claim 1, wherein the pulse signal is a current pulse.

11. The system of claim 1, wherein the system is an industrial automation motor starter.

12. A method for detecting a welded relay contact, the method comprising:
    performing a weld detection check, comprising:
        closing a first relay of a plurality of relays, wherein each relay of the plurality of relays comprises a first contact on an input side of the respective relay and a second contact on a load side of the respective relay, wherein the input side of each relay is coupled to a power source, and the load side of each relay is coupled to a load, wherein the load sides of each of the respective relays are coupled through their respective loads;
        applying a pulse to a coil of a second relay of the plurality of relays, wherein the pulse is configured to have a sufficient electrical magnitude and duration to close the second relay when the second relay has an electrical weld of one of the first contact and the second contact of the second relay and the pulse is configured to have an insufficient electrical magnitude and duration to close the first contact and the second contact of the second relay when the second relay has no electrical weld;

measuring a current flow through the second relay in response to the pulse; and based on the current flow through the second relay, determine whether the electrical weld of the one of the first contact and the second contact of the second relay exists.

13. The method of claim 12, further comprising:
performing the weld detection check on each relay of the plurality of relays sequentially.

14. The method of claim 12, further comprising:
in response to detecting no electrical weld of the one of the first contact and the second contact of the second relay:
opening the first relay;
closing the second relay;
applying the pulse to the coil of the first relay;
measuring a second current flow through the first relay in response to the pulse; and
based on the second current flow through the first relay, determine whether the electrical weld of the one of the first contact and the second contact of the first relay exists.

15. The method of claim 12, further comprising:
performing the weld detection check in response to startup of a system comprising the plurality of relays.

16. The method of claim 12, wherein an electrical signal for closing the first relay comprises a first electrical magnitude, wherein the sufficient electrical magnitude of the pulse is a percentage less than the first electrical magnitude, and wherein the sufficient duration of the pulse is selected based on the sufficient electrical magnitude.

17. The method of claim 12, further comprising:
in response to detecting the electrical weld, automatically disconnecting the power source to shut down a system comprising the plurality of relays.

18. The method of claim 12, further comprising:
based on the current flow through the second relay in response to closing the first relay, detect the electrical weld of both the first contact and the second contact of the second relay.

19. The method of claim 12, wherein the pulse is one of a voltage pulse and a current pulse.

20. A system, comprising:
a relay system, comprising a relay having a first contact on an input side of the relay, the input side coupled to a power source, and a second contact on a load side of the relay coupled to a load; and
a controller, comprising:
one or more processors; and
a memory having stored thereon instructions that, upon execution by the one or more processors, cause the one or more processors to perform a weld detection check comprising:
transmit a pulse signal to the relay, wherein the pulse signal is configured to have a sufficient electrical magnitude and duration to close the relay when the relay has an electrical weld of one of the first contact and the second contact of the relay and the pulse signal is configured to have an insufficient electrical magnitude and duration to close the first contact and the second contact of the relay when the relay has no electrical weld;
measure a current flow from the power source through the relay and load in response to the pulse signal; and
based on the current flow through the relay, determine whether the electrical weld of the one of the first contact and the second contact of the relay exists.

* * * * *